United States Patent
Yoshizawa et al.

(10) Patent No.: US 7,459,391 B2
(45) Date of Patent: Dec. 2, 2008

(54) SEMICONDUCTOR DEVICE AND METHOD OF FABRICATING THE SAME

(75) Inventors: Takahiko Yoshizawa, Yokohama (JP); Noriaki Matsunaga, Chigasaki (JP); Naofumi Nakamura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 11/208,000

(22) Filed: Aug. 22, 2005

(65) Prior Publication Data

US 2006/0091401 A1  May 4, 2006

(30) Foreign Application Priority Data

Nov. 1, 2004  (JP) ............... 2004-318375

(51) Int. Cl.
*H01L 21/4763* (2006.01)
(52) U.S. Cl. ............ 438/638; 438/637; 438/672; 438/673; 257/775; 257/E21.241; 257/E21.256
(58) Field of Classification Search ......... 438/618–622, 438/637–638, 672–673, 700
See application file for complete search history.

(56) References Cited

U.S. PATENT DOCUMENTS 5,973,444 A * 10/1999 Xu et al. .................. 313/309
6,583,047 B2 * 6/2003 Daniels et al. ............ 438/623
2005/0151266 A1   7/2005 Yoshizawa et al.
2006/0063386 A1 * 3/2006 Tsai et al. ................ 438/725

FOREIGN PATENT DOCUMENTS

JP    2002-353308 A    12/2002
JP    2003-017561 A    1/2003

OTHER PUBLICATIONS

T. Mourier et al., "Porous low k pore sealing study for 65 nm and below technologies", Proceedings of International Interconnect Technology Conference, 2003, pp. 245-247.
A. Bhanap et al., "Reparing Process-induced Damage to Porous Low-k ILDs by Post-Ash Treatment", Proceedings of Advanced Metallization Conference, 2003.

* cited by examiner

*Primary Examiner*—Dung A. Le
(74) *Attorney, Agent, or Firm*—Foley & Lardner LLP

(57) ABSTRACT

The semiconductor device fabrication method according the present invention having, forming an interlayer dielectric film containing carbon above a semiconductor substrate, forming a protective film on that portion of the interlayer dielectric film, which is close to the surface and in which the carbon concentration is low, forming a trench by selectively removing a desired region of the interlayer dielectric film and protective film, such that the region extends from the surface of the protective film to the bottom surface of the interlayer dielectric film, supplying carbon to the interface between the interlayer dielectric film and protective film, and forming a conductive layer by burying a conductive material in the trench.

6 Claims, 17 Drawing Sheets

SEMICONDUCTOR DEVICE AND METHOD OF FABRICATING THE SAME

CROSS REFERENCE TO RELATED APPLICATION

This application is based upon and claims benefit of priority under 35 USC § 119 from the Japanese Patent Application No. 2004-318375, filed on Nov. 1, 2004, the entire contents of which are incorporated herein by reference.

BACKGROUND OF THE INVENTION

The present invention relates to a semiconductor device and a method of fabricating the same.

Recently, in the formation of a multilayered interconnection, a method which uses a low-dielectric-constant film having a relative dielectric constant lower than that of a silicon oxide ($SiO_2$) film as an interlayer dielectric film is proposed, in order to reduce the wiring delay. An example of this low-dielectric-constant film is an SiOC film formed by doping substantially 10 to 20% of carbon into a silicon oxide ($SiO_2$) film.

Unfortunately, this low-dielectric-constant film has low strength and cracks during processing, causing various inconveniences in the formation of a multilayered interconnection. Therefore, a protective film which protects the low-dielectric-constant film is formed on it.

Also, since the low-dielectric-constant film contains carbon, the adhesion between the low-dielectric-constant film and its protective film is low. Therefore, high adhesion between the low-dielectric-constant film and protective film is ensured by lowering the carbon concentration near the surface of the low-dielectric-constant film before the protective film is formed.

In addition, when the protective film is to be formed by using plasma CVD (Chemical Vapor Deposition), the carbon concentration near the surface of the low-dielectric-constant film is lowered.

Although the low-dielectric-constant film is originally hydrophobic, the surface and vicinity change to have hydrophilic nature because the carbon concentration lowers.

Accordingly, the low-carbon-concentration region near the surface of the low-dielectric-constant film readily adsorbs OH and water ($H_2O$). As a consequence, the effective relative dielectric constant rises, or a process gas remaining in the low-dielectric-constant film is eliminated during the process to cause film peeling or metal corrosion.

A reference concerning the carbon concentration near the surface of the low-dielectric-constant film is as follows.

Japanese Patent Laid-Open No. 2003-17561

SUMMARY OF THE INVENTION

According to one aspect of the present invention, there is provided a semiconductor device fabrication method comprising:

forming an interlayer dielectric film containing carbon above a semiconductor substrate;

forming a protective film on a portion of the interlayer dielectric film, which is close to a surface and in which a carbon concentration is low;

forming a trench by selectively removing a desired region of the interlayer dielectric film and protective film, such that the region extends from a surface of the protective film to a bottom surface of the interlayer dielectric film;

supplying carbon to an interface between the interlayer dielectric film and protective film; and forming a conductive layer by burying a conductive material in the trench.

According to one aspect of the present invention, there is provided a semiconductor device fabrication method comprising:

forming an interlayer dielectric film containing carbon above a semiconductor substrate;

forming a protective film on a portion of the interlayer dielectric film, which is close to a surface and in which a carbon concentration is low;

forming a trench by selectively removing a desired region of the interlayer dielectric film and protective film, such that the region extends from a surface of the protective film to a bottom surface of the interlayer dielectric film;

forming a conductive layer by burying a conductive material in the trench; and supplying carbon to an interface between the interlayer dielectric film and protective film via the protective film.

According to one aspect of the present invention, there is provided a semiconductor device fabrication method comprising:

forming an interlayer dielectric film containing carbon above a semiconductor substrate;

forming a protective film on a portion of the interlayer dielectric film, which is close to a surface and in which a carbon concentration is low;

forming a trench by selectively removing a desired region of the interlayer dielectric film and protective film, such that the region extends from a surface of the protective film to a bottom surface of the interlayer dielectric film;

burying a conductive material in the trench to remove a portion of the protective film, which is to be exposed when a conductive layer is formed; and supplying carbon to the surface of the interlayer dielectric film.

According to one aspect of the present invention, there is provided a semiconductor device comprising:

a semiconductor substrate;

an interlayer dielectric film formed above said semiconductor substrate, and containing carbon;

an insulating film formed on said interlayer dielectric film; and a conductive layer formed by burying a predetermined conductive material in a trench formed in a predetermined region of at least said interlayer dielectric film, wherein said interlayer dielectric film is formed such that a carbon concentration in a position at a distance of about 10% of a film thickness of said interlayer dielectric film from an interface with said insulating film is not less than about 75% of a carbon concentration in a position except for a vicinity of the interface with said insulating film.

DETAILED DESCRIPTION OF THE INVENTION

Embodiments of the present invention will be described below with reference to the accompanying drawings.

(1) FIRST EMBODIMENTS

Figure 1:
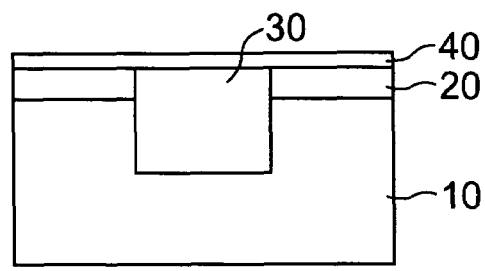
FIG. 1 is a longitudinal sectional view showing the sectional structure of an element in a predetermined step of a method of fabricating a semiconductor device according to the first embodiment of the present invention.

FIGS. 1 to 10 show a method of fabricating a semiconductor device according to the first embodiment of the present invention. First, as shown in FIG. 1, an interlayer dielectric film 10 is formed above a semiconductor substrate (not shown), and a diffusion barrier film 40 is formed on the upper surface of a protective film 20 formed on the interlayer dielectric film 10, and on the upper surface of an interconnection 30 formed in the interlayer dielectric film 10 and protective film 20.

The interconnection 30 is made of, e.g., copper (Cu). The anti-diffusion film 40 prevents diffusion of copper (Cu) from the interconnection 30, and also functions as an etching stopper. Note that the anti-diffusion film 40 is, e.g., an SiCN film, SiOC film, or silicon carbide (SiC) film, and has a relative dielectric constant of, e.g., 3.5 to 5.5.

Figure 2:
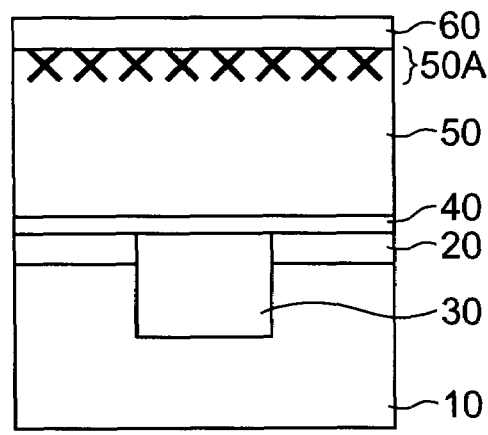
FIG. 2 is a longitudinal sectional view showing the sectional structure of an element in a predetermined step of a method of fabricating the above semiconductor device.

As shown in FIG. 2, an interlayer dielectric film 50 which is a low-dielectric-constant film having a relative dielectric constant lower than that of a silicon oxide ($SiO_2$) film is formed on the anti-diffusion film 40. The interlayer dielectric film 50 is, e.g., an SiOC film or methylsilsesquioxane (MSQ) film, and has a relative dielectric constant of, e.g., 2.6 or less.

If necessary, to increase the adhesion to a protective film to be formed on the interlayer dielectric film 50 later, the interlayer dielectric film 50 undergoes a process of lowering the carbon concentration near its surface, thereby forming a low-carbon-concentration region 50A near the surface of the interlayer dielectric film 50. More specifically, an electron beam (EB) radiation process, ultraviolet (UV) radiation process, or plasma process is performed on the surface of the interlayer dielectric film 50.

Then, a protective film 60 for protecting the interlayer dielectric film 50 is formed on it by using plasma CVD or the like. The protective film 60 is, e.g., an SiOC film, methylsilosesquioxane (MSQ) film, or silicon oxide ($SiO_2$) film, and has a relative dielectric constant of, e.g., 2.6 to 4.3. Also, the density of the protective film 60 is made higher than that of the interlayer dielectric film 50. Note that when the protective film 60 is to be formed by using a plasma process such as plasma CVD, the carbon concentration near the surface of the interlayer dielectric film 50 lowers, so it is unnecessary to perform the process of lowering the carbon concentration near the surface of the interlayer dielectric film 50.

Figure 3:
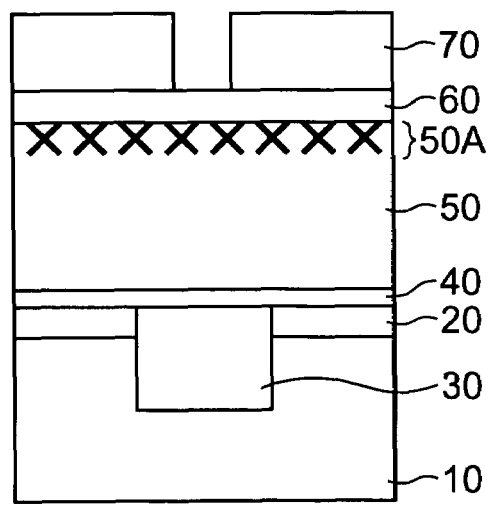
FIG. 3 is a longitudinal sectional view showing the sectional structure of an element in a predetermined step of a method of fabricating the above semiconductor device.

As shown in FIG. 3, after the protective film 60 is coated with a photoresist material, exposure and development are performed to form a mask material 70 having a pattern corresponding to the lower interconnection 30.

Figure 4:
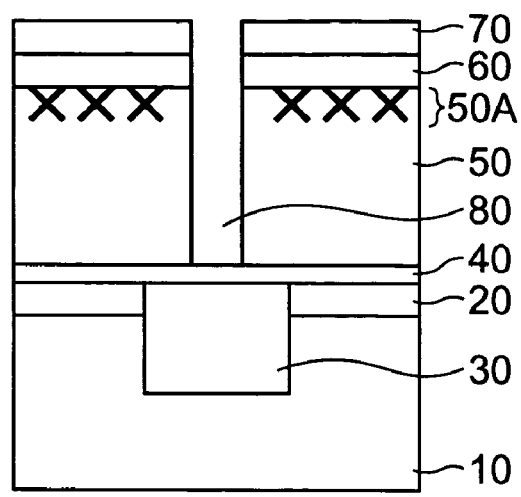
FIG. 4 is a longitudinal sectional view showing the sectional structure of an element in a predetermined step of a method of fabricating the above semiconductor device.

As shown in FIG. 4, the protective film 60 and interlayer dielectric film 50 are etched by using the mask material 70 as a mask and the anti-diffusion film 40 as an etching stopper, thereby forming a via hole (connecting hole) 80. After that, ashing is performed to remove the mask material 70 by oxidation.

Figure 5:
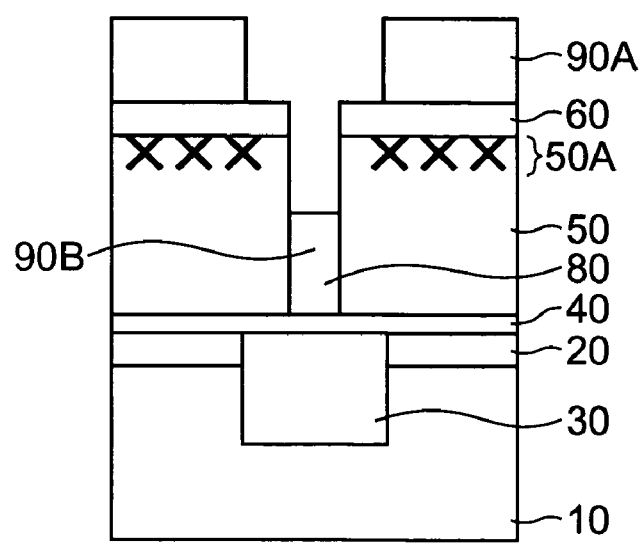
FIG. 5 is a longitudinal sectional view showing the sectional structure of an element in a predetermined step of a method of fabricating the above semiconductor device.

As shown in FIG. 5, after the protective film 60 and anti-diffusion film 40 are coated with a photoresist material, exposure and development are performed to form a mask material 90A having a pattern corresponding to the via hole 80. A mask material (photoresist material) 90B may remain in the via hole 80.

Figure 6:
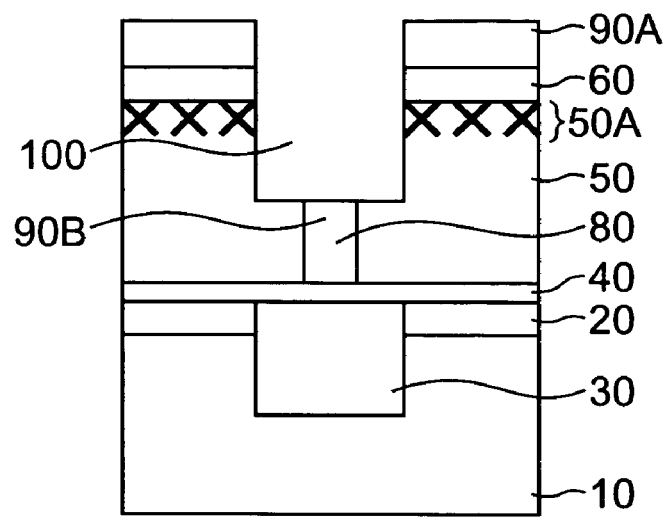
FIG. 6 is a longitudinal sectional view showing the sectional structure of an element in a predetermined step of a method of fabricating the above semiconductor device.

As shown in FIG. 6, after the protective film 60 is etched by using the mask material 90A as a mask, the interlayer dielectric film 50 is further etched by designating the etching time, thereby forming an interconnecting trench 100.

Figure 7:
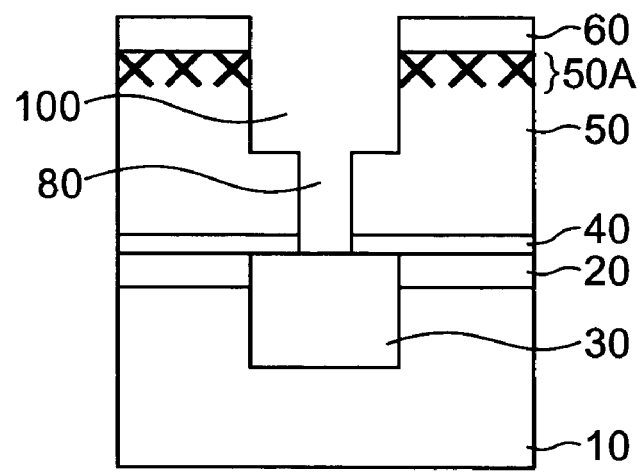
FIG. 7 is a longitudinal sectional view showing the sectional structure of an element in a predetermined step of a method of fabricating the above semiconductor device.

As shown in FIG. 7, after ashing is performed to remove the mask materials 90A and 90B by oxidation, etching is performed to form a hole in the anti-diffusion film 40, thereby exposing a portion of the upper surface of the lower interconnection 30.

Figure 8:
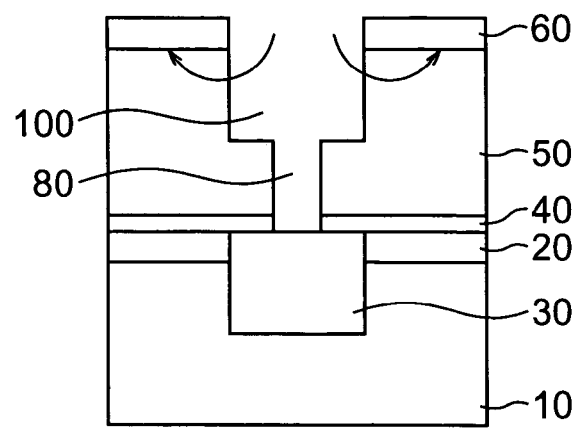
FIG. 8 is a longitudinal sectional view showing the sectional structure of an element in a predetermined step of a method of fabricating the above semiconductor device.

As shown in FIG. 8, a gas, liquid, or the like containing carbon (C) is supplied from the inner surfaces of the interconnecting trench 100 to the interface between the interlayer dielectric film 50 and protective film 60. This raises the carbon concentration in that portion (low-carbon-concentration region 50A) of the interlayer dielectric film 50, which is close to the interface with the protective film 60. If a film through which a gas or liquid can pass is used as the protective film 60, the carbon concentration may also be raised via the protective film 60.

In this manner, it is possible to maintain the hydrophobic nature of the interlayer dielectric film 50, and suppress adsorption of OH or water ($H_2O$) by the interlayer dielectric film 50. Consequently, it is possible to prevent a rise of the effective relative dielectric constant, and suppress film peeling or metal corrosion caused when the process gas remaining in the interlayer dielectric film 50 is eliminated during the process. Therefore, the yield can be increased.

An example of the method of supplying carbon (C) is a method which supplies, e.g., hexamethyidisilazane (HMDS: $(CH_3)_3SiNHSi(CH_3)_3$) to the interface between the interlayer dielectric film 50 and protective film 60 to perform a chemical reaction which substitutes Si—OH bonds with Si—C bonds, thereby raising the carbon concentration near the interface of the interlayer dielectric film 50. In this method, the hydrophobic nature of the interlayer dielectric film 50 can be maintained by substituting Si—OH bonds with Si—C bonds.

Another example of the method of supplying carbon (C) is a method which raises the carbon concentration near the interface of the interlayer dielectric film 50 by allowing a predetermined hydrophobic material containing carbon (C) to penetrate and fill that portion (low-carbon-concentration region 50A) of the interlayer dielectric film 50, which is close to the interface with the protective film 60.

In this method, examples of a liquid hydrophobic material are polyallylene ether (PAE), methylsilsesquioxane (MSQ), a predetermined resist material, and a coating material used in an antireflection film, and examples of a gas hydrophobic material are siloxane containing carbon (C), trimethyl silane (TMS), and benzcyclobutene (BCB). In the method using penetration and filling of the hydrophobic material, a desired material can be selected from among various hydrophobic materials.

The method using the chemical reaction and the method using penetration and filling of the hydrophobic material are desirably performed at a temperature of 100° C. to 350° C. That is, these methods are desirably performed at a temperature of 100° C. or more in order to evaporate water adsorbed by the interlayer dielectric film 50, and a temperature of 350° C. or less in order to suppress stress migration in which interconnections are destroyed by heat.

Figure 11:
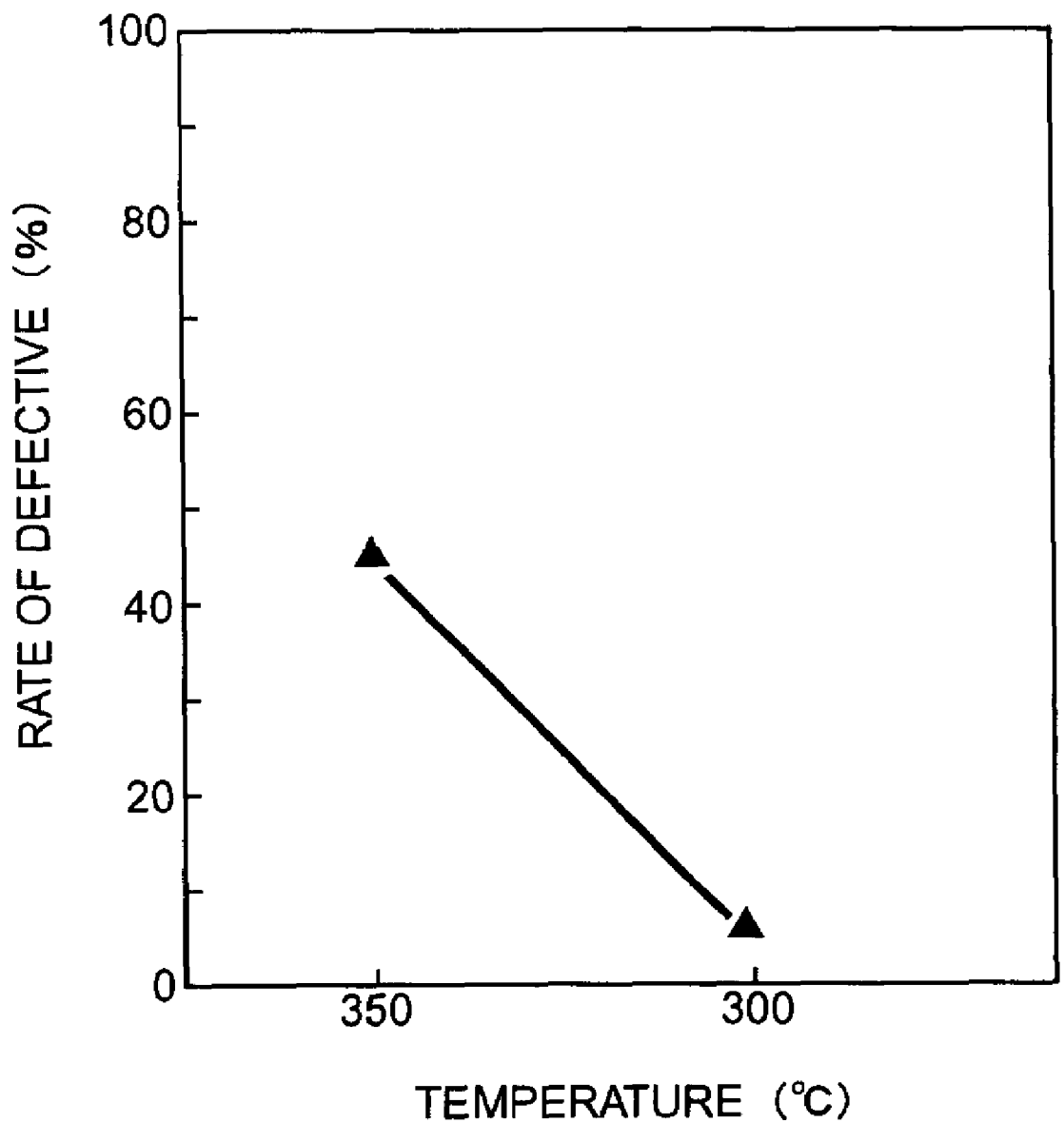
FIG. 11 is a graph showing the relationship between the temperature and the percent defective in a stress migration reliability test.

FIG. 11 shows the relationship between the temperature and the percent defective in a stress migration test (which evaluates the resistance against stress migration). As shown in FIG. 11, when the temperature is 350° C., the percent defective is about 45%. When the temperature exceeds 350° C., the percent defective further rises, and the yield lowers. Therefore, the temperature is preferably 350° C. or less.

Figure 9:
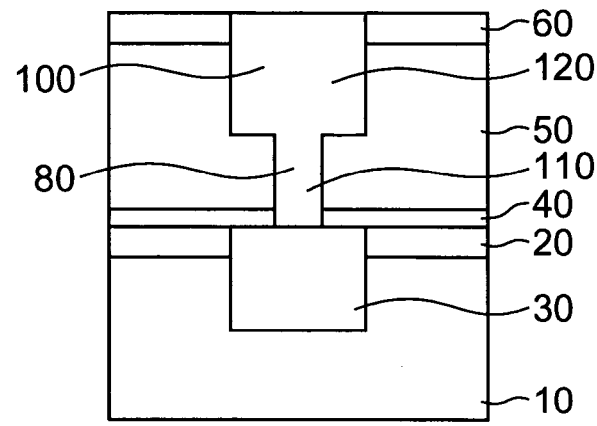
FIG. 9 is a longitudinal sectional view showing the sectional structure of an element in a predetermined step of a method of fabricating the above semiconductor device.

Also, the method using the chemical reaction and the method using penetration and filling of the hydrophobic material are preferably performed at a pressure of 1 atm or less. That is, the higher the pressure, the more easily carbon (C) is supplied to the interface between the interlayer dielectric film 50 and protective film 60. Therefore, this pressure is preferably at least 1 atm, which is the atmospheric pressure, or higher, As shown in FIG. 9, a barrier metal film (not shown) and a seed copper film (not shown) serving as a seed layer of plating are sequentially formed by sputtering on the entire surface of the interlayer dielectric film 50 and protective film 60, so as to fill the via hole 80 and interconnecting trench 100. After that, a copper film (not shown) is formed by forming a film mainly containing copper (Cu) on the entire surface by plating.

After a predetermined heating process (annealing) is performed, the barrier metal film and copper film are polished by CMP to form a plug 110 and interconnection 120.

Figure 10:
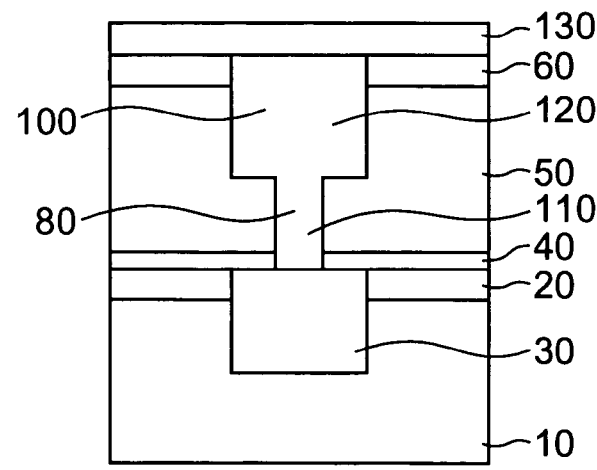
FIG. 10 is a longitudinal sectional view showing the sectional structure of an element in a predetermined step of a method of fabricating the above semiconductor device.

As shown in FIG. 10, an anti-diffusion film 130 is formed on the upper surfaces of the protective film 60 and interconnection 120. The anti-diffusion film 130 prevents diffusion of copper (Cu) from the interconnection 120, and also functions as an etching stopper. The anti-diffusion film 130 is, e.g., an SiCN film, SiOC film, or silicon carbide (SiC) film, and has a relative dielectric constant of, e.g., 3.5 to 5.5.

Figure 12:
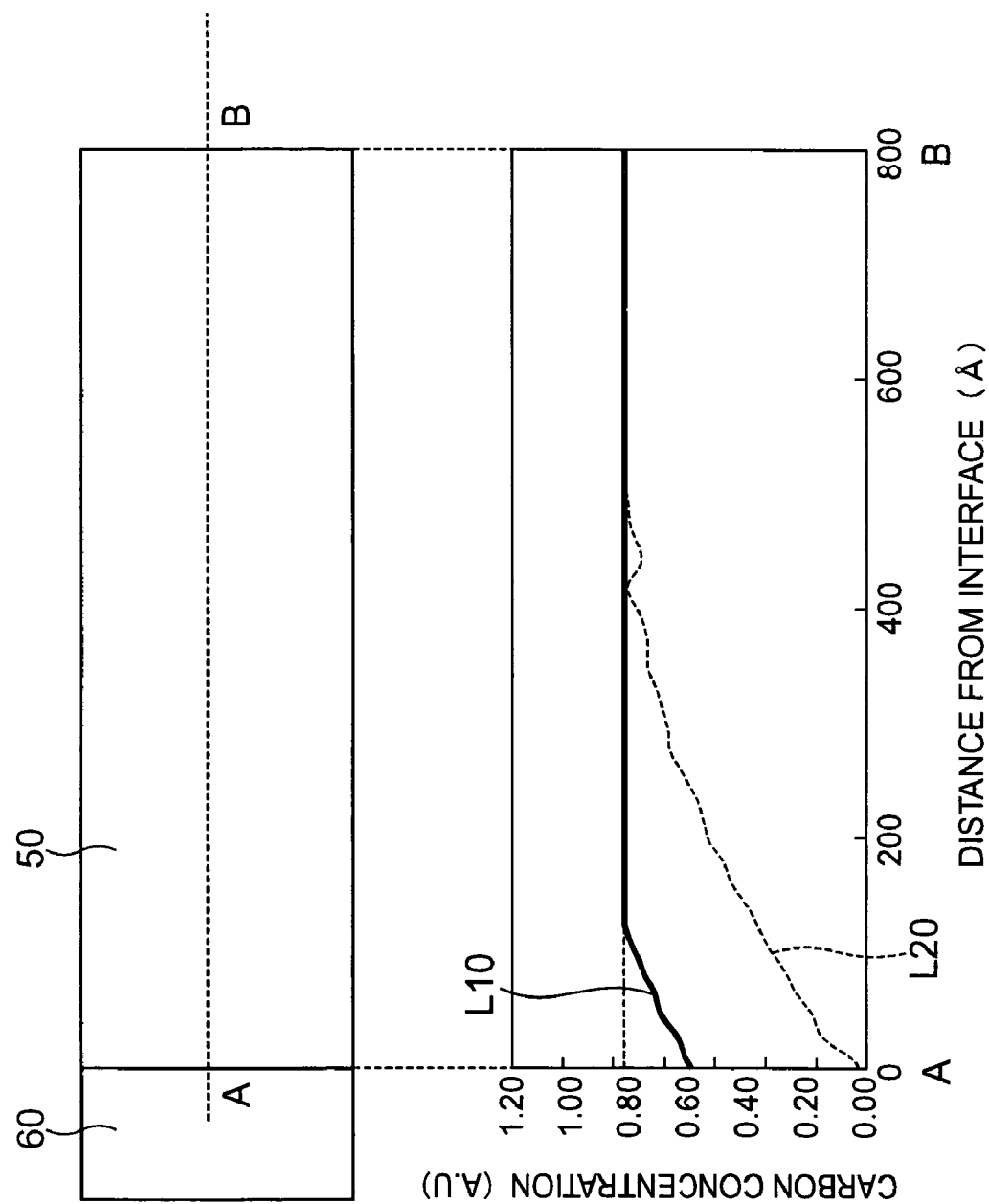
FIG. 12 is a graph showing the distance from the interface and the carbon concentration in a method using chemical reaction.

FIG. 12 shows examples of the carbon concentration distribution in the interlayer dielectric film 50, when the method using the chemical reaction is used as the method of supplying carbon (C). Note that in FIGS. 12 and 13, the abscissa indicates the distance (unit: Å) from the interface of the interlayer dielectric film 50, and the ordinate indicates the carbon concentration (unit: A.U. (Arbitrary Unit).

Referring to FIG. 12, a curve L10 indicates the carbon concentration distribution in the interlayer dielectric film 50 after carbon (C) is supplied to the interface of the interlayer dielectric film 50. A curve L20 indicates the carbon concentration distribution in the interlayer dielectric film 50 before carbon (C) is supplied to the interface of the interlayer dielectric film 50.

That is, as shown in FIG. 12, the carbon concentration near the interface of the interlayer dielectric film 50 rises and recovers after carbon (C) is supplied, compared to that before carbon (C) is supplied.

Note that, as shown in FIG. 12, when the method using the chemical reaction is used as the method of supplying carbon (C), the original carbon concentration before the process (FIG. 2) of lowering the carbon concentration is performed is not exceeded.

Figure 13:
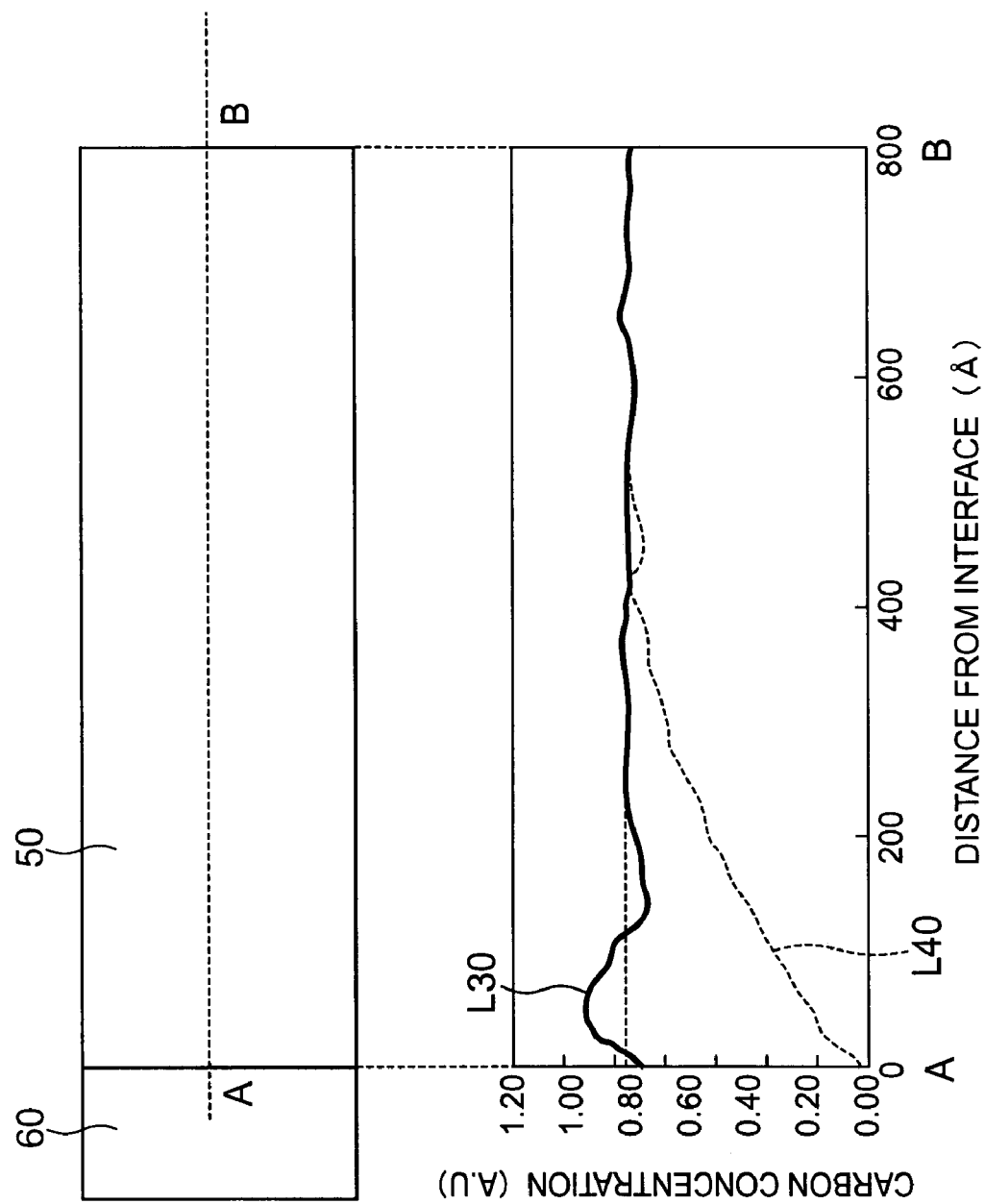
FIG. 13 is a graph showing the distance from the interface and the carbon concentration in a method using penetration and filling of a hydrophobic material.

FIG. 13 shows examples of the carbon concentration distribution in the interlayer dielectric film 50, when the method using penetration and filling of the hydrophobic material is used as the method of supplying carbon.

Referring to FIG. 13, a curve L30 indicates the carbon concentration distribution in the interlayer dielectric film 50 after carbon (C) is supplied to the interface of the interlayer dielectric film 50. A curve L40 indicates the carbon concentration distribution in the interlayer dielectric film 50 before carbon (C) is supplied to the interface of the interlayer dielectric film 50.

That is, as shown in FIG. 13, the carbon concentration near the interface of the interlayer dielectric film 50 rises and recovers after carbon (C) is supplied, compared to that before carbon (C) is supplied, as in the method using the chemical reaction.

Note that, as shown in FIG. 13, when the method using penetration and filling of the hydrophobic material is used, the original carbon concentration before the process (FIG. 2) of lowering the carbon concentration is performed is sometimes exceeded. However, the carbon concentration in the interface is lower than a maximum carbon concentration near the interface because the protective film 60 is formed.

As shown in FIGS. 12 and 13, in each of the method using the chemical reaction and the method using penetration and filling of the hydrophobic material, the carbon concentration in a position (e.g., about 80 Å) at a distance of about 10% of the film thickness of the interlayer dielectric film 50 from the interface of the interlayer dielectric film 50 is about 75% or more of the carbon concentration in a position (e.g., about 400 Å) except for the vicinity of the interface of the interlayer dielectric film 50.

(2) SECOND EMBODIMENTS

Figure 14:
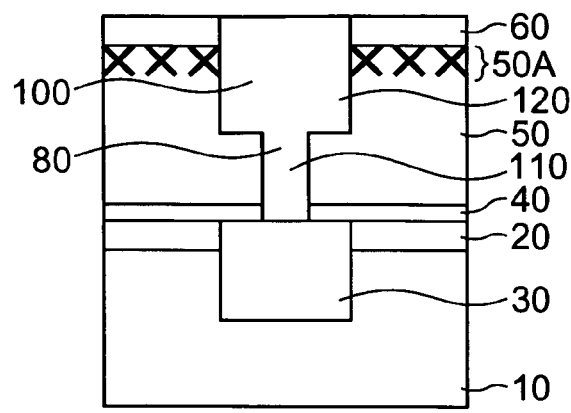
FIG. 14 is a longitudinal sectional view showing the sectional structure of an element in a predetermined step of a method of fabricating a semiconductor device according to the second embodiment of the present invention.
Figure 15:
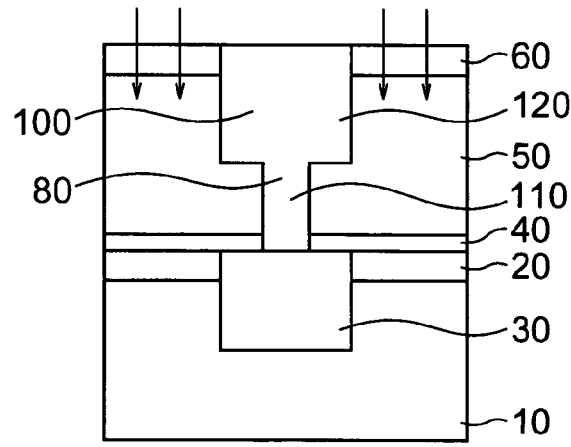
FIG. 15 is a longitudinal sectional view showing the sectional structure of an element in a predetermined step of a method of fabricating the above semiconductor device.
Figure 16:
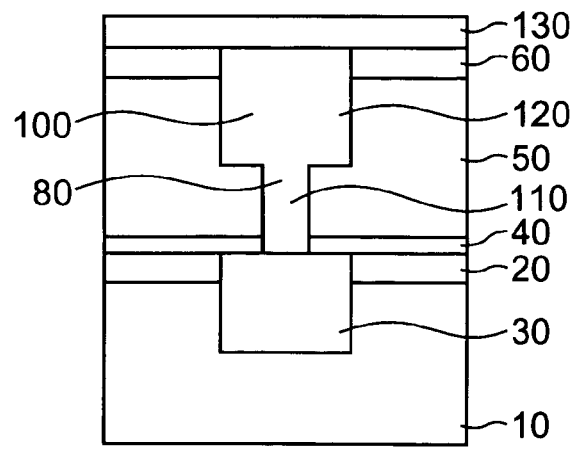
FIG. 16 is a longitudinal sectional view showing the sectional structure of an element in a predetermined step of a method of fabricating the above semiconductor device.

FIGS. 14 to 16 show a method of fabricating a semiconductor device according to the second embodiment of the present invention. Note that steps from the formation of a via hole 80 and interconnecting trench 100 to the exposure of a portion of the upper surface of a lower interconnection 30 are the same as the steps shown in FIGS. 1 to 7 of the first embodiment, so an explanation thereof will be omitted.

As shown in FIG. 14, a barrier metal film (not shown) and a seed copper film (not shown) serving as a seed layer of plating are sequentially formed by sputtering on the entire surface of an interlayer dielectric film 50 and protective film 60, so as to fill the via hole 80 and interconnecting trench 100. After that, a copper film (not shown) is formed by forming a film mainly containing copper (Cu) on the entire surface by plating.

After a predetermined heating process (annealing) is performed, the barrier metal film and copper film are polished by CMP to form a plug 110 and interconnection 120.

As shown in FIG. 15, a gas, liquid, or the like containing carbon (C) is supplied from above the protective film 60 to the interface between the interlayer dielectric film 50 and protective film 60 via the protective film 60. This raises the carbon concentration in that portion (low-carbon-concentration region 50A) of the interlayer dielectric film 50, which is close to the interface with the protective film 60.

In this manner, it is possible to maintain the hydrophobic nature of the interlayer dielectric film 50, and suppress adsorption of OH or water ($H_2O$) by the interlayer dielectric film 50. Consequently, it is possible to prevent a rise of the effective relative dielectric constant, and suppress film peeling or metal corrosion caused when the process gas remaining in the interlayer dielectric film 50 is eliminated during the process. Therefore, the yield can be increased.

As in the first embodiment, the method of supplying carbon (C) may be a method using chemical reaction or a method using penetration and filling of a hydrophobic material. The conditions such as the temperature and pressure of these methods are also the same as in the first embodiment.

In this embodiment, a gas, liquid, or the like containing carbon (C) is supplied to the interface of the interlayer dielectric film 50 via the protective film 60, this gas or liquid must pass through the protective film 60. Therefore, the relative dielectric constant of the protective film 60 is desirably, e.g., 2.6 to 2.9.

Also, in this embodiment, a gas, liquid, or the like containing carbon (C) is supplied after the plug 110 and interconnection 120 are formed. Accordingly, it is possible to prevent the residue of the gas, liquid, or the like from building up in the via hole 80 and interconnecting trench 100.

As shown in FIG. 16, a multilayered interconnection is formed by forming an anti-diffusion film 130 on the upper surfaces of the protective film 60 and interconnection 120.

(3) THIRD EMBODIMENTS

Figure 17:
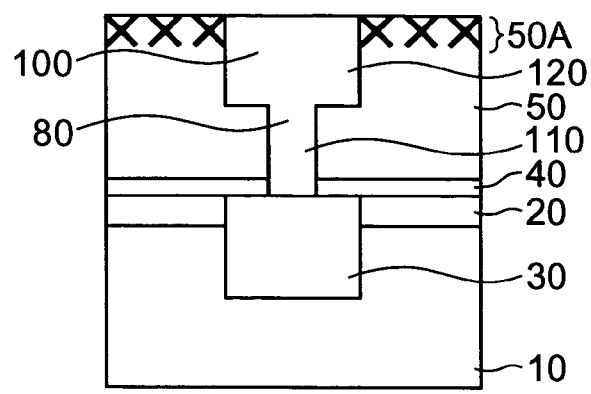
FIG. 17 is a longitudinal sectional view showing the sectional structure of an element in a predetermined step of a method of fabricating the above semiconductor device.
Figure 18:
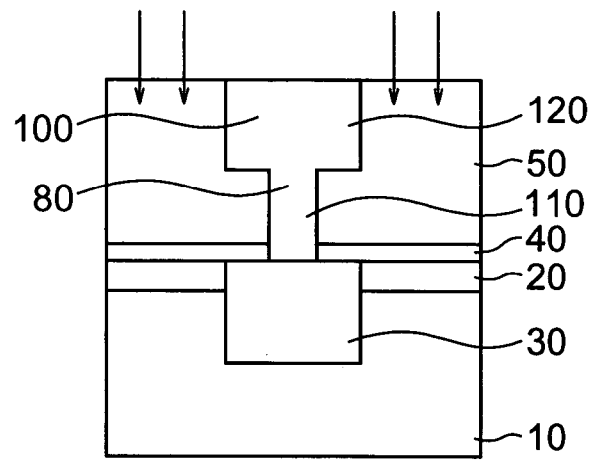
FIG. 18 is a longitudinal sectional view showing the sectional structure of an element in a predetermined step of a method of fabricating the above semiconductor device.
Figure 19:
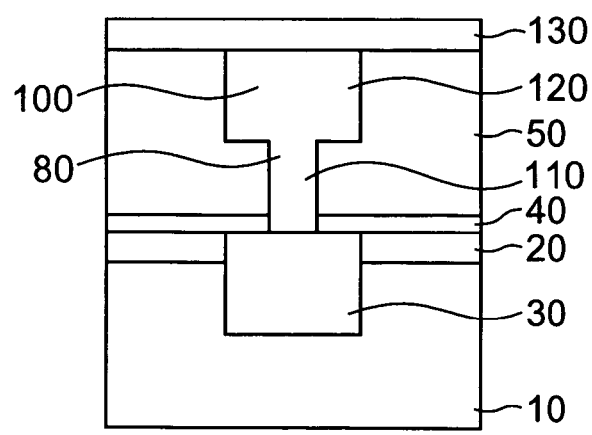
FIG. 19 is a longitudinal sectional view showing the sectional structure of an element in a predetermined step of a method of fabricating the above semiconductor device.

FIGS. 17 to 19 show a method of fabricating a semiconductor device according to the third embodiment of the present invention. Note that steps from the formation of a via hole 80 and interconnecting trench 100 to the exposure of a portion of the upper surface of a lower interconnection 30 are the same as the steps shown in FIGS. 1 to 7 of the first embodiment, so an explanation thereof will be omitted.

As shown in FIG. 17, a barrier metal film (not shown) and a seed copper film (not shown) serving as a seed layer of plating are sequentially formed by sputtering on the entire surface of an interlayer dielectric film 50 and protective film 60, so as to fill the via hole 80 and interconnecting trench 100. After that, a copper film (not shown) is formed by forming a film mainly containing copper (Cu) on the entire surface by plating.

After a predetermined heating process (annealing) is performed, the barrier metal film and copper film are polished by CMP to form a plug 110 and interconnection 120. In this embodiment, when the barrier metal film and copper film are polished by CMP to remove the unnecessary barrier metal film and copper film, the protective film 60 is also removed to expose the upper surface of the interlayer dielectric film 50. The protective film 60 may also be removed before the copper film is formed.

As shown in FIG. 18, a gas, liquid, or the like containing carbon (C) is supplied from above the interlayer dielectric film 50 to the surface of the interlayer dielectric film 50, thereby raising the carbon concentration in a portion (low-carbon-concentration region 50A) near the surface of the interlayer dielectric film 50.

In this manner, it is possible to maintain the hydrophobic nature of the interlayer dielectric film 50, and suppress adsorption of OH or water ($H_2O$) by the interlayer dielectric film 50. Consequently, it is possible to prevent a rise of the effective relative dielectric constant, and suppress film peeling or metal corrosion caused when the process gas remaining in the interlayer dielectric film 50 is eliminated during the process. Therefore, the yield can be increased.

As in the first embodiment, the method of supplying carbon (C) may be a method using chemical reaction or a method using penetration and filling of a hydrophobic material. The conditions such as the temperature and pressure of these methods are also the same as in the first embodiment.

As shown in FIG. 19, a multilayered interconnection is formed by forming a diffusion barrier film 130 on the upper surfaces of the interlayer dielectric film 50 and interconnection 120.

In the first and second embodiments, the protective film 60 formed on the interlayer dielectric film 50 must withstand polishing by CMP in the steps shown in FIGS. 9 and 14, so it is necessary to ensure high adhesion between the interlayer dielectric film 50 and protective film 60. Therefore, the protective film 60 is formed after the process of lowering the carbon concentration near the surface of the interlayer dielectric film 50 is performed, thereby increasing the adhesion between the interlayer dielectric film 50 and protective film 60.

By contrast, in this embodiment, no strong force is applied to the anti-diffusion film 130 formed on the interlayer dielectric film 50 in any step of the fabrication process, unlike the protective film 60 in the first and second embodiments. Accordingly, no such high adhesion as between the interlayer dielectric film 50 and protective film 60 is necessary between the interlayer dielectric film 50 and anti-diffusion film 130. Therefore, the anti-diffusion film 130 can be formed after the carbon concentration near the surface of the interlayer dielectric film 50 is raised by supplying carbon (C) to the surface of the interlayer dielectric film 50.

(4) FOURTH EMBODIMENTS

Figure 20:
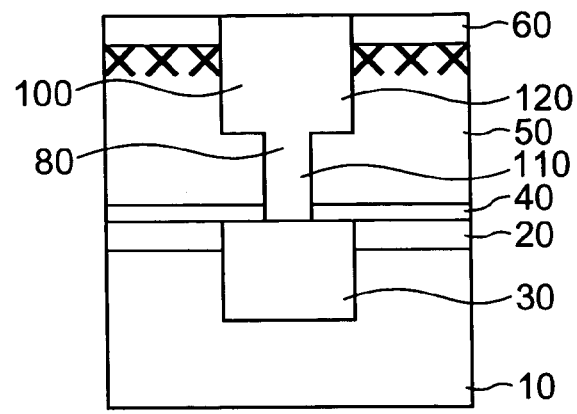
FIG. 20 is a longitudinal sectional view showing the sectional structure of an element in a predetermined step of a method of fabricating the above semiconductor device.
Figure 21:
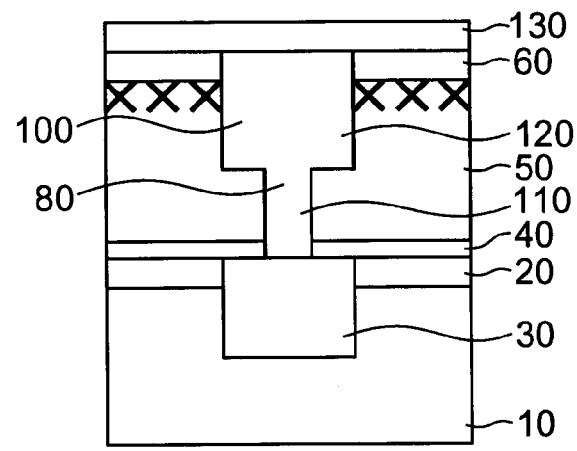
FIG. 21 is a longitudinal sectional view showing the sectional structure of an element in a predetermined step of a method of fabricating the above semiconductor device.
Figure 22:
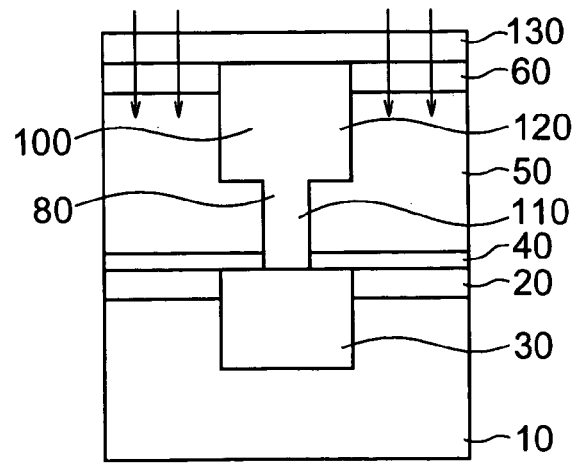
FIG. 22 is a longitudinal sectional view showing the sectional structure of an element in a predetermined step of a method of fabricating the above semiconductor device.

FIGS. 20 to 22 show a method of fabricating a semiconductor device according to the fourth embodiment of the present invention. Note that steps from the formation of a via hole 80 and interconnecting trench 100 to the exposure of a portion of the upper surface of a lower interconnection 30 are the same as the steps shown in FIGS. 1 to 7 of the first embodiment, so an explanation thereof will be omitted.

As shown in FIG. 20, a barrier metal film (not shown) and a seed copper film (not shown) serving as a seed layer of plating are sequentially formed by sputtering on the entire surface of an interlayer dielectric film 50 and protective film 60, so as to fill the via hole 80 and interconnecting trench 100. After that, a copper film (not shown) is formed by forming a film mainly containing copper (Cu) on the entire surface by plating.

After a predetermined heating process (annealing) is performed, the barrier metal film and copper film are polished by CMP to form a plug 110 and interconnection 120.

As shown in FIG. 21, a multilayered interconnection is formed by forming a diffusion barrier film 130 on the upper surfaces of the interlayer dielectric film 50 and interconnection 120.

As shown in FIG. 22, a gas, liquid, or the like containing carbon (C) is supplied from above the anti-diffusion film 130 to the interface between the interlayer dielectric film 50 and protective film 60 via the anti-diffusion film 130 and protective film 60. This raises the carbon concentration in a portion (low-carbon-concentration region 50A) near the interface of the interlayer dielectric film 50.

In this manner, it is possible to maintain the hydrophobic nature of the interlayer dielectric film 50, and suppress adsorption of OH or water ($H_2O$) by the interlayer dielectric film 50. Consequently, it is possible to prevent a rise of the effective relative dielectric constant, and suppress film peeling or metal corrosion caused when the process gas remaining in the interlayer dielectric film 50 is eliminated during the process. Therefore, the yield can be increased.

As in the first embodiment, the method of supplying carbon (C) may be a method using chemical reaction or a method using penetration and filling of a hydrophobic material. The conditions such as the temperature and pressure of these methods are also the same as in the first embodiment.

In this embodiment, since a gas, liquid, or the like containing carbon (C) is supplied to the interface of the interlayer dielectric film 50 via the anti-diffusion film 130 and protective film 60, this gas or liquid must pass through the protective film 60. Therefore, the relative dielectric constant of the protective film 60 is desirably, e.g., 2.6 to 2.9, and that of the anti-diffusion film 130 is desirably, e.g., 4.0 or less.

Also, in this embodiment, a gas, liquid, or the like containing carbon (C) is supplied after the plug 110 and interconnection 120 are formed. Accordingly, it is possible to prevent the residue of the gas, liquid, or the like from building up in the via hole 80 and interconnecting trench 100.

(5) FIFTH EMBODIMENTS

Figure 23:
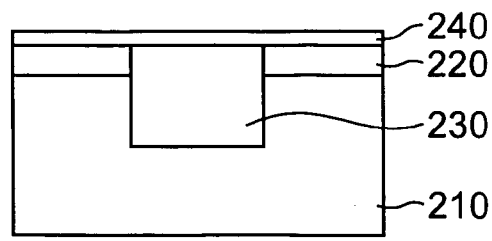
FIG. 23 is a longitudinal sectional view showing the sectional structure of an element in a predetermined step of a method of fabricating the above semiconductor device.

FIGS. 23 to 32 show a method of fabricating a semiconductor device according to the fifth embodiment of the present invention. First, as shown in FIG. 23, an interlayer dielectric film 210 is formed above a semiconductor substrate (not shown), and a diffusion barrier film 240 is formed on the upper surface of a protective film 220 formed on the interlayer dielectric film 210, and on the upper surface of an interconnection 230 formed in the interlayer dielectric film 210 and protective film 220. The anti-diffusion film 240 prevents diffusion of copper (Cu) from the interconnection 230, and also functions as an etching stopper.

Figure 24:
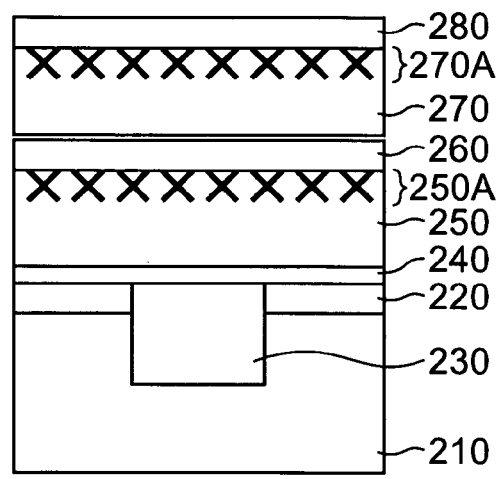
FIG. 24 is a longitudinal sectional view showing the sectional structure of an element in a predetermined step of a method of fabricating the above semiconductor device.

As shown in FIG. 24, an interlayer dielectric film 250 which is a low-dielectric-constant film having a relative dielectric constant lower than that of a silicon oxide ($SiO_2$) film is formed on the anti-diffusion film 240.

To increase the adhesion to a protective film to be formed on the interlayer dielectric film 250 later, the interlayer dielectric film 250 undergoes a process of lowering the carbon concentration near the surface of the interlayer dielectric film 250, thereby forming a low-carbon-concentration region 250A near the surface of the interlayer dielectric film 250.

Then, a protective film 260 for protecting the interlayer dielectric film 250 is formed on it by using plasma CVD or the like.

By repeating the above steps, an interlayer dielectric film 270 is formed on the protective film 260, a low-carbon-concentration region 270A is formed near the surface of the interlayer dielectric film 270, and a protective film 280 is formed on the interlayer dielectric film 270.

Figure 25:
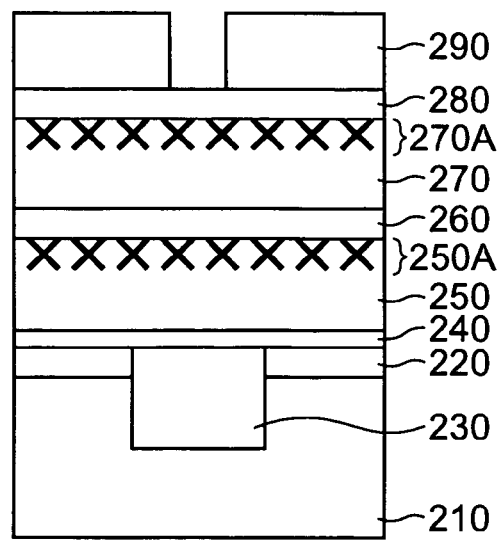
FIG. 25 is a longitudinal sectional view showing the sectional structure of an element in a predetermined step of a method of fabricating the above semiconductor device.

As shown in FIG. 25, after the protective film 280 is coated with a photoresist material, exposure and development are performed to form a mask material 290 having a pattern corresponding to the lower interconnection 230.

Figure 26:
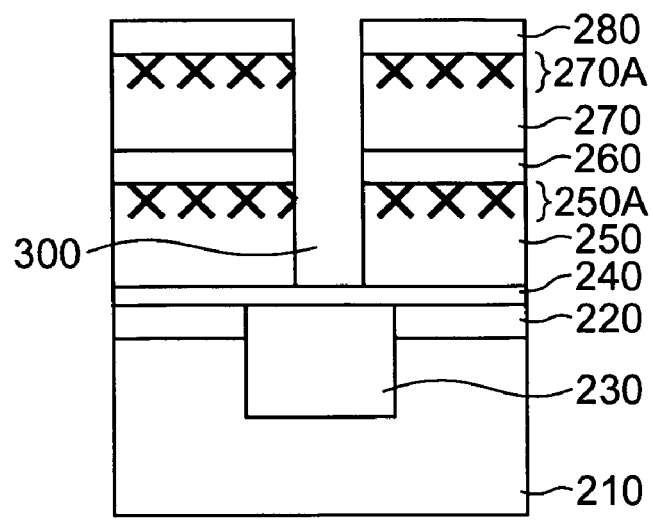
FIG. 26 is a longitudinal sectional view showing the sectional structure of an element in a predetermined step of a method of fabricating the above semiconductor device.

As shown in FIG. 26, the interlayer dielectric films 250 and 270 and protective films 260 and 280 are etched by using the mask material 290 as a mask and the anti-diffusion film 240 as an etching stopper, thereby forming a via hole (connecting hole) 300. After that, ashing is performed to remove the mask material 290 by oxidation.

Figure 27:
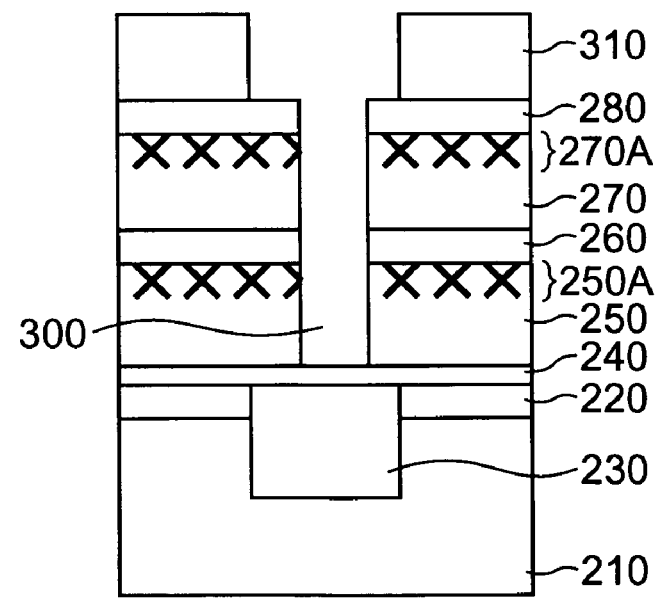
FIG. 27 is a longitudinal sectional view showing the sectional structure of an element in a predetermined step of a method of fabricating the above semiconductor device.

As shown in FIG. 27, after the protective film 280 is coated with a photoresist material, exposure and development are performed to form a mask material 310 having a pattern corresponding to the via hole 300.

Figure 28:
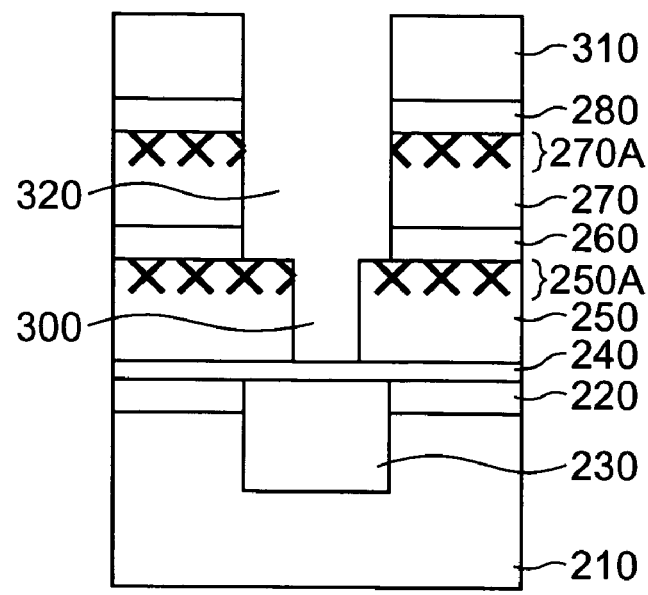
FIG. 28 is a longitudinal sectional view showing the sectional structure of an element in a predetermined step of a method of fabricating the above semiconductor device.

As shown in FIG. 28, the protective film 280 is etched by using the mask material 310 as a mask, the interlayer dielectric film 270 is etched by using the protective film 260 as an etching stopper, and subsequently the protective film 260 is etched to form an interconnecting trench 320. In this step, the end position of the etching can be accurately controlled if a protective film 260 having a density higher than that of the interlayer dielectric film 250 is formed on it.

Figure 29:
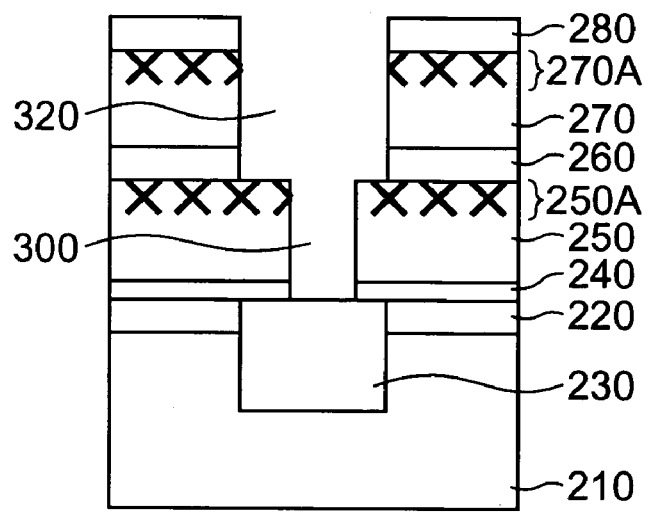
FIG. 29 is a longitudinal sectional view showing the sectional structure of an element in a predetermined step of a method of fabricating the above semiconductor device.

As shown in FIG. 29, after ashing is performed to remove the mask material 310 by oxidation, etching is performed to form a hole in the anti-diffusion film 240, thereby exposing a portion of the upper surface of the lower interconnection 230.

Figure 30:
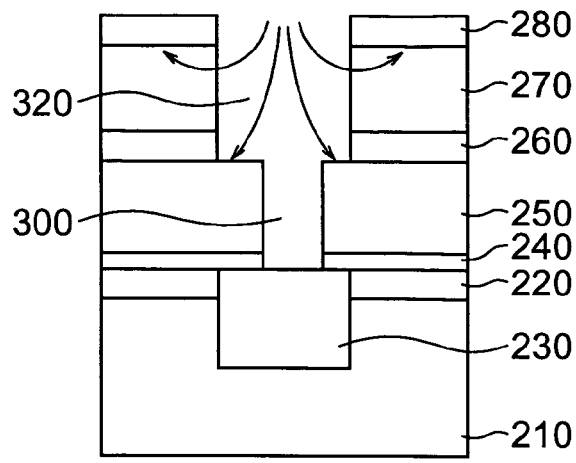
FIG. 30 is a longitudinal sectional view showing the sectional structure of an element in a predetermined step of a method of fabricating the above semiconductor device.

As shown in FIG. 30, a gas, liquid, or the like containing carbon (C) is supplied from the inner surfaces of the interconnecting trench 320 and via hole 300 to the interface between the interlayer dielectric film 270 and protective film 280, and to the interface between the interlayer dielectric film 250 and protective film 260. This raises the carbon concentration in that portion (low-carbon-concentration region 270A) of the interlayer dielectric film 270, which is close to the interface with the protective film 280, and the carbon concentration in that portion (low-carbon-concentration region 250A) of the interlayer dielectric film 250, which is close to the interface with the protective film 260.

In this manner, it is possible to maintain the hydrophobic nature of the interlayer dielectric film 250, and suppress adsorption of OH or water ($H_2O$) by the interlayer dielectric film 250. Consequently, it is possible to prevent a rise of the effective relative dielectric constant, and suppress film peeling or metal corrosion caused when the process gas remaining in the interlayer dielectric films 250 and 270 is eliminated during the process. Therefore, the yield can be increased.

As in the first embodiment, the method of supplying carbon (C) may be a method using chemical reaction or a method using penetration and filling of a hydrophobic material. The conditions such as the temperature and pressure of these methods are also the same as in the first embodiment.

Figure 31:
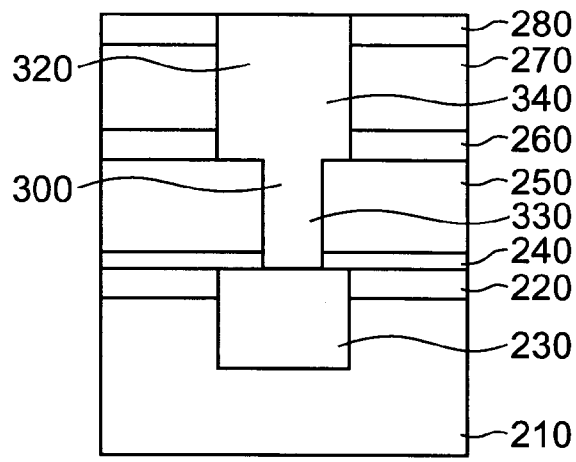
FIG. 31 is a longitudinal sectional view showing the sectional structure of an element in a predetermined step of a method of fabricating the above semiconductor device.

As shown in FIG. 31, a barrier metal film (not shown) and a seed copper film (not shown) serving as a seed layer of plating are sequentially formed by sputtering on the entire surface of the interlayer dielectric films 250 and 270 and protective films 260 and 280, so as to fill the via hole 300 and interconnecting trench 320. After that, a copper film (not shown) is formed by forming a film mainly containing copper (Cu) on the entire surface by plating.

After a predetermined heating process (annealing) is performed, the barrier metal film and copper film are polished by CMP to form a plug 330 and interconnection 340.

Figure 32:
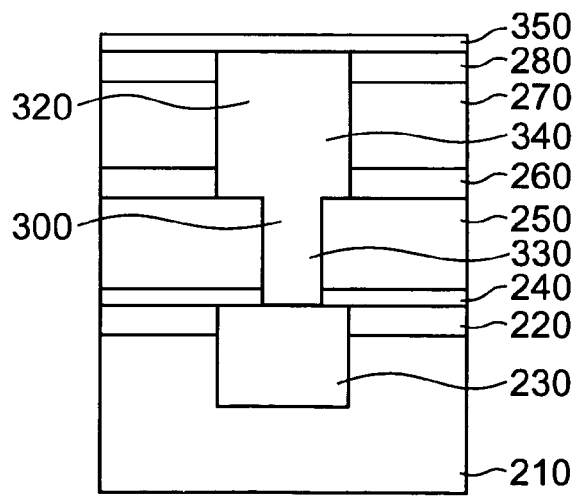
FIG. 32 is a longitudinal sectional view showing the sectional structure of an element in a predetermined step of a method of fabricating the above semiconductor device.

As shown in FIG. 32, an anti-diffusion film 350 is formed on the upper surfaces of the protective film 280 and interconnection 340. The anti-diffusion film 350 prevents diffusion of copper (Cu) from the interconnection 340, and also functions as an etching stopper.

In this embodiment, before the plug 330 and interconnection 340 are formed, carbon (C) is supplied from the inner surfaces of the via hole 300 and interconnecting trench 320 to the interface between the interlayer dielectric film 270 and protective film 280, and to the interface between the interlayer dielectric film 250 and protective film 260. However, as in the second embodiment, it is also possible, after the plug 330 and interconnection 340 are formed, to supply carbon (C) to the interface between the interlayer dielectric film 270 and protective film 280, and to the interlayer dielectric film 250 and protective film 260 via the protective film 280, interlayer dielectric film 270, and protective film 260 in this order.

In addition, as in the third embodiment, it is also possible, when the plug 330 and interconnection 340 are formed, to remove the protective film 280 to expose the upper surface of the interlayer dielectric film 270, supply carbon (C) to the surface of the interlayer dielectric film 270, supply carbon (C) to the interface between the interlayer dielectric film 250 and protective film 260 via the interlayer dielectric film 270 and protective film 260 in this order, and then form a diffusion barrier film 350 on the upper surfaces of the interlayer dielectric film 270 and interconnection 320.

Furthermore, as in the fourth embodiment, it is also possible, after the plug 330, interconnection 340, and anti-diffusion film 350 are formed, to supply carbon (C) to the interface between the interlayer dielectric film 270 and protective film 280 via the anti-diffusion film 350 and protective film 280, and supply carbon (C) to the interface between the interlayer dielectric film 250 and protective film 260 via the anti-diffusion film 350, protective film 280, interlayer dielectric film 270, and protective film 260 in this order.

(6) SIXTH EMBODIMENTS

Figure 33:
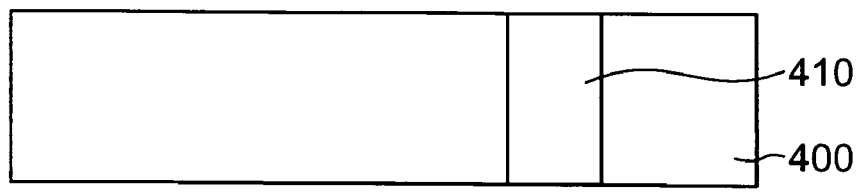
FIG. 33 is a longitudinal sectional view showing the sectional structure of an element in a predetermined step of a method of fabricating the above semiconductor device.

FIGS. 33 to 39 show a method of fabricating a semiconductor device according to the sixth embodiment of the present invention. First, as shown in FIG. 33, an interlayer dielectric film 400 and a plug 410 such as a tungsten plug are formed above a semiconductor substrate having a semiconductor element (not shown).

Figure 34:
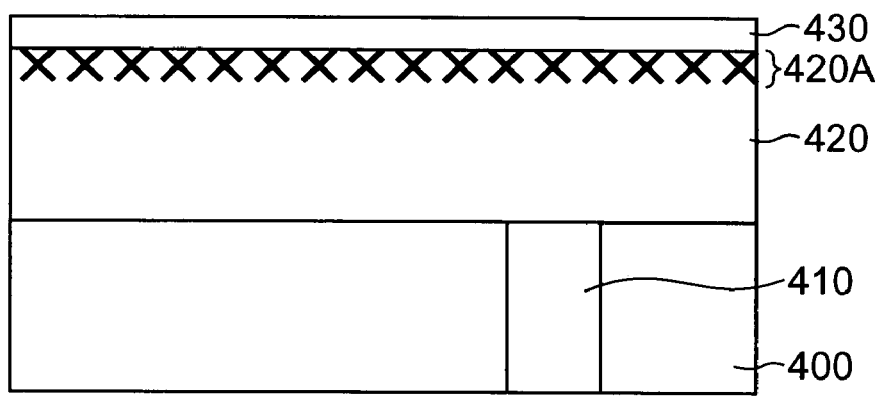
FIG. 34 is a longitudinal sectional view showing the sectional structure of an element in a predetermined step of a method of fabricating the above semiconductor device.

As shown in FIG. 34, an interlayer dielectric film 420 is formed on the interlayer dielectric film 400 and plug 410. To increase the adhesion to a protective film to be formed on the interlayer dielectric film 420 later, the interlayer dielectric film 420 undergoes a process of lowering the carbon concentration near the surface of the interlayer dielectric film 420, thereby forming a low-carbon-concentration region 420A near the surface of the interlayer dielectric film 420.

Then, a protective film 430 for protecting the interlayer dielectric film 420 is formed on it by using plasma CVD or the like.

Figure 35:
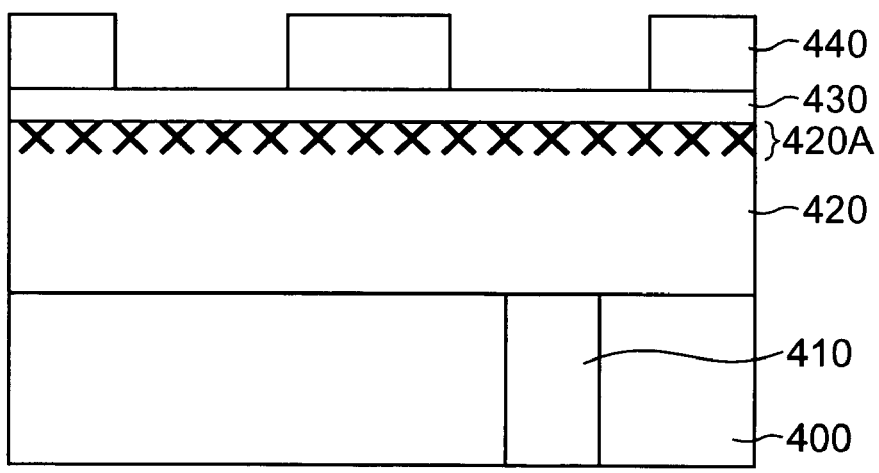
FIG. 35 is a longitudinal sectional view showing the sectional structure of an element in a predetermined step of a method of fabricating the above semiconductor device.

As shown in FIG. 35, after the protective film 430 is coated with a photoresist material, exposure and development are performed to form a mask material 440 having a predetermined pattern.

Figure 36:
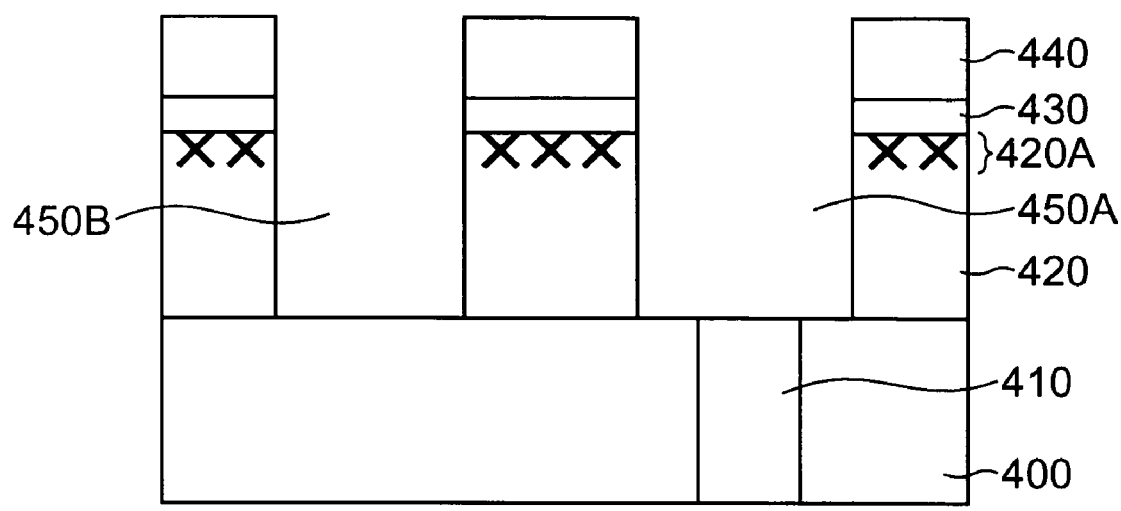
FIG. 36 is a longitudinal sectional view showing the sectional structure of an element in a predetermined step of a method of fabricating the above semiconductor device.

As shown in FIG. 36, the protective film 430 and interlayer dielectric film 420 are etched by using the mask material 440 as a mask, thereby forming interconnecting trenches 450A and 450B.

Figure 37:
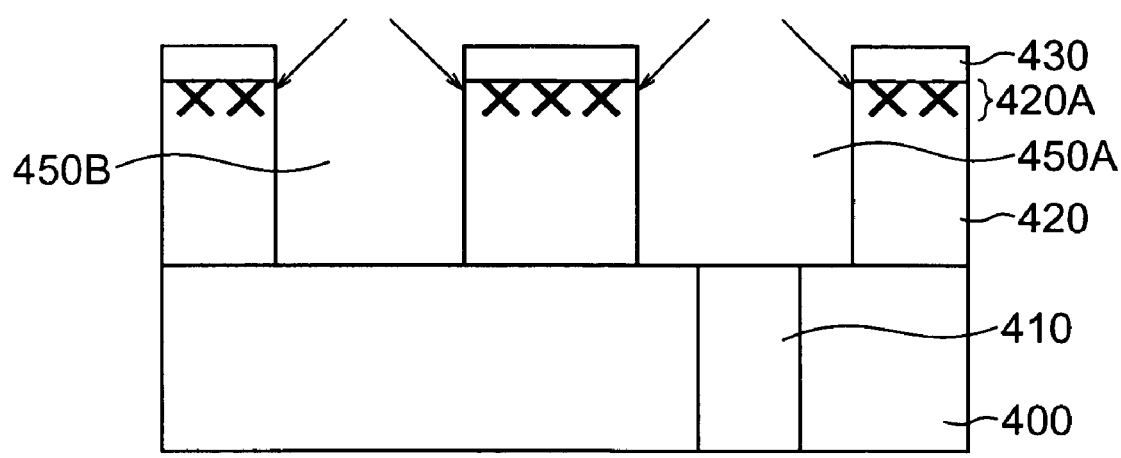
FIG. 37 is a longitudinal sectional view showing the sectional structure of an element in a predetermined step of a method of fabricating the above semiconductor device.

As shown in FIG. 37, after ashing is performed to remove the mask material 440 by oxidation, a gas, liquid, or the like containing carbon (C) is supplied from the inner surfaces of the interconnecting trenches 450A and 450B to the interface between the interlayer dielectric film 420 and protective film 430. This raises the carbon concentration in that portion (low-carbon-concentration region 420A) of the interlayer dielectric film 420, which is close to the interface with the protective film 430.

In this manner, it is possible to maintain the hydrophobic nature of the interlayer dielectric film 420, and suppress adsorption of OH or water ($H_2O$) by the interlayer dielectric film 420. Consequently, it is possible to prevent a rise of the effective relative dielectric constant, and suppress film peeling or metal corrosion caused when the process gas remaining in the interlayer dielectric films 420 is eliminated during the process. Therefore, the yield can be increased.

As in the first embodiment, the method of supplying carbon (C) may be a method using chemical reaction or a method using penetration and filling of a hydrophobic material. The conditions such as the temperature and pressure of these methods are also the same as in the first embodiment.

Figure 38:
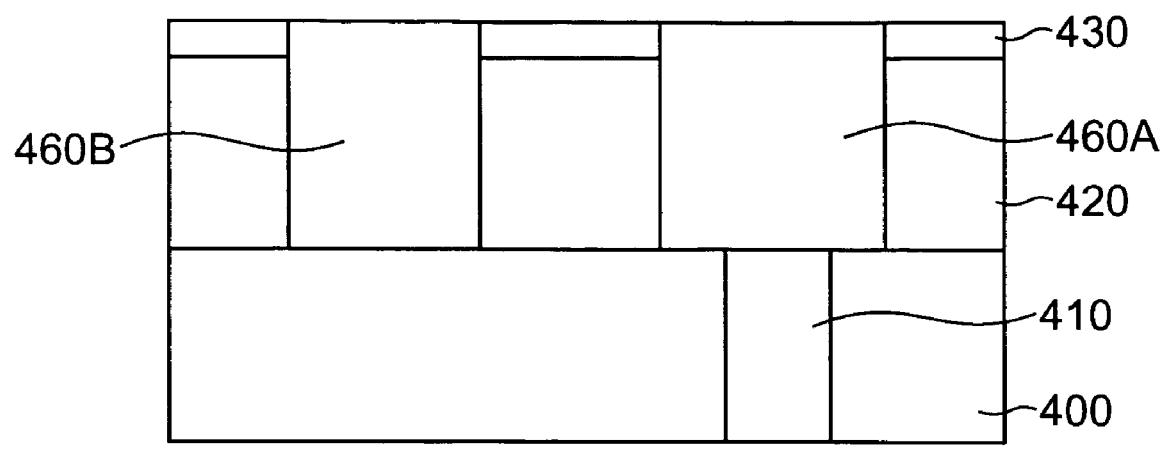
FIG. 38 is a longitudinal sectional view showing the sectional structure of an element in a predetermined step of a method of fabricating the above semiconductor device.

As shown in FIG. 38, a barrier metal film (not shown) and a seed copper film (not shown) serving as a seed layer of plating are sequentially formed by sputtering on the entire surface of the interlayer dielectric films 400 and 420 and protective film 430, so as to fill the interconnecting trenches 450A and 450B. After that, a copper film (not shown) is formed by forming a film containing copper (Cu) as its main component on the entire surface by plating.

After a predetermined heating process (annealing) is performed, the barrier metal film and copper film are polished by CMP to form interconnections 460A and 460B.

Figure 39:
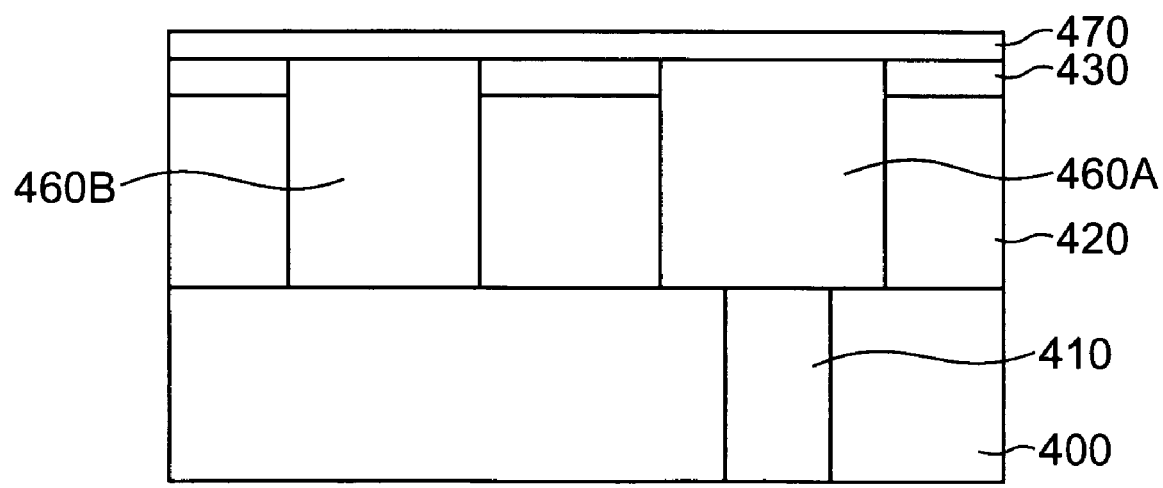
FIG. 39 is a longitudinal sectional view showing the sectional structure of an element in a predetermined step of a method of fabricating the above semiconductor device.

As shown in FIG. 39, an anti-diffusion film 470 is formed on the upper surfaces of the protective film 430 and interconnections 460A and 460B. The anti-diffusion film 470 prevents diffusion of copper (Cu) from the interconnections 460A and 460B, and also functions as an etching stopper.

In this embodiment, before the interconnections 460A and 460B are formed, carbon (C) is supplied from the inner surfaces of the interconnecting trenches 450A and 450B to the interface between the interlayer dielectric film 420 and protective film 430. However, as in the second embodiment, it is also possible, after the interconnections 460A and 460B are formed, to supply carbon (C) to the interface between the interlayer dielectric film 420 and protective film 430 via the protective film 430.

In addition, as in the third embodiment, it is also possible, when the interconnections 460A and 460B are formed, to remove the protective film 430 to expose the upper surface of the interlayer dielectric film 420, and then supply carbon (C) to the surface of the interlayer dielectric film 420.

Furthermore, as in the fourth embodiment, it is also possible, after the interconnections 460A and 460B and anti-diffusion film 470 are formed, to supply carbon (C) to the interface between the interlayer dielectric film 420 and protective film 430 via the anti-diffusion film 470 and protective film 430.

(7) OTHER EMBODIMENTS

The above embodiments are merely examples and hence do not limit the present invention. For example, copper (Cu) is used as the material of the plugs 110 and 330 and interconnections 120, 340, and 460. However, it is also possible to bury any of various conductive materials such as aluminum (Al) in the via holes 80 and 300 and/or the interconnecting trenches 100, 320, and 450 formed in the interlayer dielectric films 50, 250, 270, and 420 and/or the protective films 60, 260, 280, and 430, thereby forming conductive layers made of the plugs 110 and 330 and/or the interconnections 120, 340, and 460.

As has been explained above, the semiconductor devices and the methods of fabricating the same in the above embodiments can maintain the hydrophobic nature of the low-dielectric-constant film, and increase the yield.

What is claimed is:

1. A semiconductor device fabrication method comprising:
   forming an interlayer dielectric film containing carbon above a semiconductor substrate;
   forming a protective film on a portion of the interlayer dielectric film, which is close to a surface and in which a carbon concentration is low;
   forming a trench by selectively removing a desired region of the interlayer dielectric film and protective film, such that the region extends from a surface of the protective film to a bottom surface of the interlayer dielectric film;
   supplying a gas which includes a carbon element to the trench;
   supplying carbon to an interface between the interlayer dielectric film and protective film; and
   forming a conductive layer by burying a conductive material in the trench.

2. A method according to claim 1, when the protective film is formed, the protective film is formed on the interlayer dielectric film after a surface treatment which lowers the carbon concentration near the surface of the interlayer dielectric film is performed.

3. A method according to claim 1, when carbon is supplied, hexamethydisilazane is supplied to cause a chemical reaction which substitutes Si—OH bonds with Si—C bonds in the portion of the interlayer dielectric film, which is close to the surface and in which the carbon concentration is low.

4. A method according to claim 3, when carbon is supplied, the chemical reaction is performed at a temperature of 100° C. to 350° C.

5. A method according to claim 1, when carbon is supplied, one of a group including siloxane, trimethy silane and bezcyclobutene is allowed to penetrate and fill the portion of the interlayer doelectric film, which is close to the surface and in which the carbon concentration is low.

6. A method according to claim 1, further comprising:
   forming a second interlayer dielectric film containing carbon on the protective film after the protective film is formed; and
   forming a second protective film on a portion of the second interlayer dielectric film, which is close to a surface and in which a carbon concentration is low,
   when the trench is formed, the trench is formed by selectively removing a desired region from the second protective film to the interlayer dielectric film, such that the region extends from a surface of the second protective film to the bottom surface of the interlayer dielectric film, and
   when carbon is supplied, carbon is supplied to the interface between the interlayer dielectric film and protective film, and to an interface between the second interlayer dielectric film and second protective film.

* * * * *